United States Patent [19]
Schwalm et al.

[11] Patent Number: 4,812,542
[45] Date of Patent: Mar. 14, 1989

[54] COPOLYMERS HAVING O-NITROCARBINOL ESTER GROUPS AND PREPARATION THEREOF

[75] Inventors: Reinhold Schwalm, Wachenheim; Horst Binder, Lampertheim, both of Fed. Rep. of Germany

[73] Assignee: BASF Aktiengesellschaft, Ludwigshafen, Fed. Rep. of Germany

[21] Appl. No.: 130,291

[22] Filed: Dec. 8, 1987

[30] Foreign Application Priority Data

Dec. 10, 1986 [DE] Fed. Rep. of Germany ....... 3642184

[51] Int. Cl.⁴ .......................... C08F 26/06; C08F 20/34
[52] U.S. Cl. .................................... 526/265; 526/279; 526/284; 526/292.9; 526/311
[58] Field of Search ................ 526/311, 265, 279, 284, 526/292.9

[56] References Cited

U.S. PATENT DOCUMENTS 3,849,137 11/1974 Barzynski et al. ................. 430/294
4,343,889 8/1982 Reichmanis et al. .
4,382,120 5/1983 Reichmanis et al. .
4,400,461 8/1983 Chandross et al. .
4,551,416 11/1985 Chandross et al. .
4,576,902 3/1986 Saenger et al. ..................... 430/275
4,666,820 5/1987 Chandross et al. .
4,735,885 4/1988 Hopf et al. .......................... 430/192

FOREIGN PATENT DOCUMENTS 2800905 7/1978 Fed. Rep. of Germany ...... 526/311
2922746 12/1980 Fed. Rep. of Germany .
53-99295 8/1978 Japan ................................. 526/311

OTHER PUBLICATIONS

Journal of Vacuum Science and Technology, p. 1331, 1981.
Introduction to Microlithography, ACS Symp. Ser. 219, L. F. Thomson, C. G. Willson, M. J. Bowden, eds., pp. 215-277, Amer. Chem. Soc., Wash., D.C. (1983).
Polymer, vol. 24, p. 999 (1983).

Primary Examiner—Joseph L. Schofer
Assistant Examiner—N. Sarofim
Attorney, Agent, or Firm—Keil & Weinkauf

[57] ABSTRACT

Copolymers containing from 5 to 50 mol % of monomers having o-nitrocarbinol ester groups, from 95 to 50 mol % of O-substituted p-hydroxystyrene and from 0 to 30 mol % of other copolymerizable monomers are useful for producing positive-working photoresists and light-sensitive coating materials.

5 Claims, No Drawings

COPOLYMERS HAVING O-NITROCARBINOL ESTER GROUPS AND PREPARATION THEREOF

The present invention relates to a copolymer having o-nitrocarbinol ester groups and the preparation thereof and to the production of a light-sensitive coating material for photoresists for the production of semiconductor elements, planographic printing plates and etoh resist, in particular to a copolymer which contains, as copolymerized units, 0-substituted p-hydroxystyrene units and to a positive-working photoresist produced therefrom which, after exposure to shortwave UV light, for example within the wavelength region from 300 nm to 190 nm, can be washed out with an alkaline solvent, is sufficiently stable to plasma etching and is usable in particular for photolithography.

In lithographic processes, for example to produce semiconductor elements, numerous light-sensitive resist materials are used. On exposure, these materials undergo a change in solubility in the exposed areas which results in solvent discrimination between exposed and unexposed areas. In positive-working resists, the exposed areas show better solubility in a suitable solvent than the unexposed areas. Conventional positive-working photoresists are predominantly systems comprising a photo-insensitive, alkali-soluble matrix based on novolaks and a photosensitive component which acts as a solubility inhibitor and is converted by exposure into alkali-soluble products, so that the exposed areas in their entirety become soluble in the alkaline developer. It is true that these systems have proven very useful, but exposure to short-wave UV light presents difficulties since the novolak matrix is strongly absorbent in the wavelength region below 300 nm, making exposure in the relevant film thickness range greater than 0.5 μm impractical.

Photosensitive polymers for use as resists for the shortwave UV region are for example poly(methyl methacrylate), copolymers of methyl methacrylate and indenone (J. Vac. Sci. Techn. 19 (1981), 1333) and copolymers of methyl methacrylate and 3-oximino-2-butanone as photoactive component (for example U.S. Pat. No. 4,382,120 and US 4,343,889).

There are also existing two-component systems comprising a poly(methyl methacrylate-co-methacrylic acid) matrix and o-nitrobenzyl esters, for example esters of cholic acid, for use as solubility inhibitors (cf. for example DE-A-3,415,791).

One-component resists from copolymers which contain o-nitrobenzylcarbinol ester groups are described for example in DE-A-2,150,691 and DE-A-2,922,746.

While the resists for the shortwave UV region are sufficiently stable to wet etch processing, their stability to fluorine- and chlorine-containing plasmas, which may additionally contain oxygen, as used for etching in semiconductor element fabrication, is limited and in need of improvement.

It is an object of the present invention to describe new copolymers and the use thereof, in particular positive-working resists produced therefrom, which make it possible in particular to produce resist patterns, have high thermal stability and resistance to fluorine- and chlorine-containing plasmas, and, after exposure to shortwave UV light, can be washed out with alkaline solvents.

We have found that this object is achieved, surprisingly, with a copolymer of a certain composition which contains, as copolymerized units, not only o-nitrobenzylcarbinol ester groups but also 0-substituted p-hydroxystyrene units.

The present invention accordingly provides a copolymer which contains, as copolymerized units, (a) from 5 to 50 mol % of one or more compounds of the general formula (I)

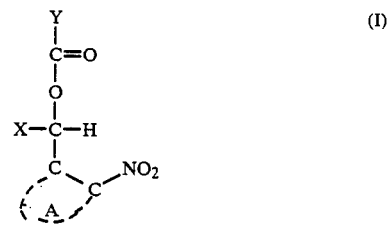

where A is an aromatic or heteroaromatic, substituted or unsubstituted ring system of 5 to 14 ring members, X is hydrogen, alkyl of 1 to 8 carbon atoms, or substituted or unsubstituted aryl or aralkyl, and Y is an ethylenically unsaturated radical of 2 to 6 carbon atoms, (b) from 95 to 50 mol % of one or more compounds of the general formula (II)

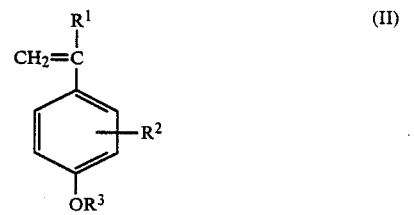

where $R^1$ is hydrogen or methyl, $R^2$ is hydrogen, halogen or alkyl of 1 to 6 carbon atoms, $R^3$ is hydrogen, alkyl of 1 to 6 carbon atoms, acetyl, benzoyl, $C_1$-$C_6$-alkylsilyl, $C_1$-$C_6$-alkoxysilyl or tert.-butoxycarbonyl, and (c) from 0 to 30 mol % of one or more further olefinically unsaturated, copolymerizable organic compounds, other than (a) and (b), whose homopolymers are transparent within the wavelength region from 250 to 400 nm, with the proviso that the percentages mentioned under (a) to (c) add up to 100.

Preference is given to those copolymers where radical Y in the general formula (I) is one of the radicals

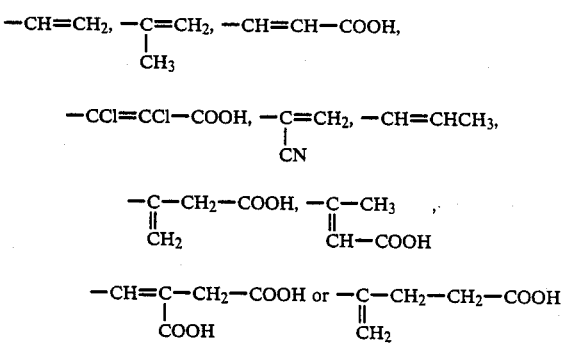

According to the invention, these copolymers are prepared by polymerizing the compounds mentioned under (a) to (c) in the presence of free radical initiators, with the proviso that $R^3$ of component (b) is alkyl of 1 to 6 carbon atoms, acetyl, benzoyl, $C_1$-$C_6$-alkylsilyl, $C_1$-$C_6$-alkoxysilyl or tert.-butoxycarbonyl, and the copolymer obtained is if appropriate converted into the copolymer where $R^3$ is H.

The present invention also provides in particular a photoresist which contains a copolymer according to the invention and can be washed out with aqueous alkaline solvents, and to a process for producing a semiconductor element on the basis of this copolymer. Theppresent invention further concerns the use of the polymer according to the invention for producing light-sensitive coating materials, dry resists and printing plates.

The light-sensitive copolymer according to the invention containing o-nitrocarbinol ester groups and 0substituted p-hydroxystyrene units can be washed out with an aqueous alkaline solvent after imggewise exposure and complete or partial conversion of the group $R^3$ into $R^3$=H. To obtain high thermal stability, it is advantageous to select the monomers in such a way that the glass transition temperature of the copolymer is above 100° C. The polymer according to the invention is highly suitable for use as a photoresist.

The hydroxy function ($R^3$=H) of the 0-substituted p-hydroxystyrene units is blocked during the polymerization by a protective group. Before development, this protective group is necessarily wholly or partly split off, which can be done before coating, during prebake or in a postbake.

In what follows, the components of which the copolymer according to the invention is composed will be discussed in detail.

(a) Suitable o-nitrocarbinol ester monomers of the general formula (I)

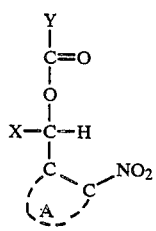

(I)

where A is an aromatic or heteroaromatic, substituted or unsubstituted ring system of 5 to 14 ring members, X is hydrogen, alkyl of 1 to 8 carbon atoms, or substituted or unsubstituted aryl or aralkyl, and Y is an ethylenically unsaturated radical of 2 to 6 carbon atoms, are for example those where the radical Y in the general formula (I) is one of the radicals

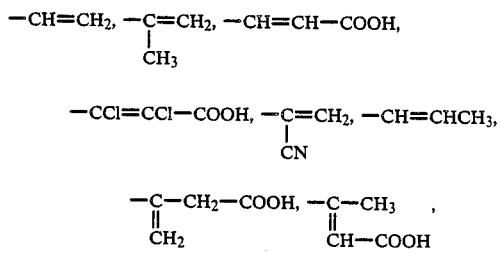

-continued
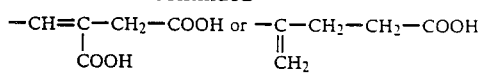

In this definition, an aromatic ring system A comprises in particular benzene or a substituted benzene. The benzene ring can be monosubstituted or polysubstituted, for example by $C_1$-$C_8$-alkyl, in particular methyl, by $C_1$-$C_6$-alkoxy, in particular methoxy, by halogen, such as chlorine, by nitro or amino, and by sulfo. Also possible are substituted and unsubstituted polynuclear benzene derivatives, such as naphthalene, anthracene, anthraquinone and phenanthrene. A heteroaromatic ring system A is in particular pyridine. Particularly suitable aromatic and heteroaromatic o-nitrocarbinols from which to derive the o-nitrocarbinol ester groups have proven to be for example: o-nitrobenzyl, 6-nitroveratryl, 2-nitro-4-aminobenzyl, 2-nitro-4-dimethyl-amino-benzyl, 2-nitro-4-methylaminobenzyl, 2-nitro-5dimethylaminobenzyl, 2-nitro-5-aminobenzyl, 2-nitro-4,6dimethoxybenzyl, 2,4-dinitrobenzyl, 3-methyl-2,4-dinitrobenzyl, 2-nitro-4-methylbenzyl or 2,4,6-trinitrobenzyl alcohol, and also 2-nitrobenzhydrol, 2,2'-dinitrobenzhydrol, 2,4-dinitrobenzhydrol and 2,2',4,4'-tetranitrobenzhydrol. Similarly suitable are for example 2-nitro-3-hydroxymethyl-naphthalene, 1-nitro-2-hydroxymethylnaphthalene and 1-nitro-2-hydroxymethylanthraquinone.

The copolymer according to the invention is based as stated above on an o-nitrocarbinol ester of an olefinically unsaturated carboxylic acid as monomer, the ethylenically unsaturated mono- or dicarboxylic acid being for example acrylic acid, methacrylic acid, maleic acid, dichloromaleic acid, fumaric acid, crotonic acid, itaconic acid or methyleneglutaric acid.

The o-nitrocarbinol esters of olefinically unsaturated carboxylic acids can be prepared by known methods of organic chemistry, for example by reacting the acid chlorides with o-nitrocarbinols or by direct acid-catalyzed esterification.

Particularly preferred o-nitrocarbinol ester monomers are o-nitrobenzyl acrylate, o-nitrobenzyl methacrylate, o-nitro-α-methylbenzyl (meth)acrylate and 2-nitro-6-chloro-α-methylbenzyl (meth)acrylate.

The copolymer according to the invention contains o-nitrocarbinol ester monomers (a) in an amount from 5 to 50, preferably from 10 to 30, mol % as copolymerized units.

(b) Comonomers (b) present in the copolymer according to the invention as copolymerized units comprise compounds of the general formula (II)

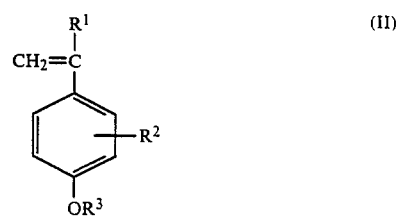

(II)

where $R^1$ is hydrogen or methyl, $R^2$ is hydrogen, halogen, for example chlorine, or alkyl of 1 to 6 carbon atoms, and $R^3$ is hydrogen, alkyl of 1 to 6 carbon atoms, acetyl, benzoyl, $C_1$-$C_6$-alkylsilyl, $C_1$-$C_6$-alkoxysilyl or tert.-butoxycarbonyl.

Particularly preferred 0-substituted p-hydroxystyrene derivatives are those where the phenolic hydroxyl group is etherified or esterified, eg. p-methoxystyrene, p-acetoxystyrene or p-tert.-butoxycarbonyloxystyrene.

Component (b) is present as copolymerized units in an amount from 95 to 50, preferably from 90 to 70, mol % in the copolymer according to the invention.

(c) To improve the solubility in aqueous alkaline solvents or to obtain other properties, such as increased thermal stability, the copolymer according to the invention may also contain as copolymerized units one or more olefinically unsaturated copolymerizable organic compounds, other than (a) and (b), whose homopolymers are transparent in the wavelength region from 250 to 400 nm.

Examples of suitable comonomers of this type are ethylenically unsaturated carboxylic acids, such as (meth)acrylic acid, maleic acid, fumaric acid, crotonic acid, itacnic acid and/or methylene glutaric acid, other ethylenically unsaturated compounds, such as ethylene, aromatic vinyl compounds, such as styrene, dienes, such as isoprene, butadiene, esters of the abovementioned olefinically unsaturated carboxylic acids, such as esters of acrylic and in particular methacrylic acid with $C_1$–$C_8$-alcohols, preferably methyl methacrylate, and also other derivatives of acrylic acid and/or methacrylic acid.

The monomers (c) can be present as copolymerized units in the copolymer according to the invention in amounts from 0 to 30, preferably from 0 to 20, mol %.

The mole percentages of (a) to (c) in the copolymer according to the invention add up to 100.

Examples of particularly preferred copolymers according to the invention are those of o-nitro-α-methylbenzyl methacrylate and p-tert.-butoxycarbonyloxystyrene, o-nitro-α-methylbenzyl acrylate, p-tert.-butoxycarbonyloxystyrene and p-vinylanisole, o-ntiro-α-methylbenzyl (meth)acrylate, p-tert.-butoxycarbonyloxystyrene and methacrylic acid, o-nitro-α-methylbenzyl (meth)acrylate, p-tert.-butoxycarbonyloxystyrene and acrylic acid, and o-nitro-α-methylbenzyl(meth) acrylate, p-tert.-butoxycarbonyloxystyrene and p-methoxysilyloxystyrene.

For developability with aqueous alkaline solvents, it is necessary that the substituted styrene derivatives be wholly or partly converted into p-hydroxystyrene derivatives before development of the imagewise exposed areas. Neither the undeblocked copolymers nor copolymers of o-nitrobenzyl acrylates with styrene prepared in a similar manner, as described in DE-A-2,150,691, are properly developable with aqueous alkaline solutions even after very long exposure times.

The copolymer according to the invention is preparable from the particular monomers by a conventional method of polymerization, for which the monomers are preferably chosen in such a way that the glass transition temperature of the resulting copolymer is above 100° C. To this end, the monomers can for example be heated for several hours at 60°–120° C. in a suitable solvent, such as ethyl acetate, toluene or acetone, together with a polymerization initiator, such as benzoyl peroxide or azobisisobutyronitrile. This reaction is advantageously conducted in such a way that the conversion is not substantially more than 50%, in order to obtain a relatively low molecular weight.

The molecular weight can be determined by the polymerization conditions, such as reaction temperature, type of initiator and initiator concentration, and also type of solvent and monomer concentration. To obtain a molecular weight within the range from 1,000 to 500,000 which is favorable for photoresist applications, preferred ranges are from 60 to 120oC for the polymerization temperature, from 0.1 to 5 mol % for the initiator concentration and from 3 to 50% for the monomer concentration. The molecular weight and the molecular weight distribution have a substantial influence on the solubility in a particular developer. The lower the molecular weight and the narrower the molecular weight distribution, the better and the more uniform the developability. Preference is therefore given to molecular weights within the range from 1,000 to 500,000 g/mol, particularly preferably from 5,000 to 100,000 g/mol, and molecular weight distributions <3.

The use of the copolymer according to the invention is not restricted to application as a photoresist for fabricating semiconductor components; it can also be used in light-sensitive coating materials such as dry resists and printing plates. For these applications, other ingredients such as dyes, pigments, sensitizers and other additives may be added to the light-sensitive materials.

As mentioned, the resist according to the invention is very highly suitable for photolithography for the structuring of semiconductors. In such a process, the polymer is dissolved in a suitable solvent, for example diethylene glycol dimethyl ether, cyclohexanone or methylcellosolve acetate, in a solids content in general from 5% by weight to 30% by weight. The solution can advantageously be filtered through a polytetrafluoroethylene filter (pore diameter about 0.2 μm) and for example be applied by spin coating at 1,000–10,000 rpm to silicon wafers to form resist layers from 0.2 μm to 2.0 μm in thickness. After baking, the film is exposed through a quartz mask by the contact or projection technique. The bake conditions depend in each case on the copolymer used. Copolymers having t-butoxycarbonyl protective groups are preferably treated in such a way that the protective group is filtered off thermally, at from 160° to 200° C., before or after exposure. Other protective groups are preferably split off in solution before the resist is applied, and the bake then takes place above the glass transition temperature of the particular polymer. Exposure is continued until the imagewise exposed areas are completely developed. Suitable light sources are alternatively Hg high pressure lamps, Cd-Xe lamps or Excimer lasers in the wavelength region below 350 nm, preferably 248 nm (KrF). After exposure, the resist is developed with an aqueous alkaline developer, such as 2% strength tetramethylammonium hydroxide solution, 1% strength NaOH, 10% strength $NaHCO_3$ or a commercial positive developer, eg. Developer S (from Kodak) or P4 (from Merck). The development time is in general from 30 seconds to 2 minutes. It should be chosen in such a way that stripping in the unexposed areas amounts to not more than 5%, bearing in mind that the degree of stripping in the unexposed areas in a particular developer is also affected in particular by the presence of p-hydroxystyrene or other water- 9r alkali-soluble components in the polymer.

To transfer the resist pattern thus produced to the substrate underneath, plasma processes are very frequently used in industry. A description of plasma etching technique can be found inter alia in Introduction to Microlithography, ACS Symp. Ser. 219, L.F. Thomson, C.G. Willson, M.J. Bowden, Eds., American Chemical Soc., Washington DC (1983) in chapter 5.

Silicon and silicon dioxide substrates are generally etched with fluorine-containing plasmas. The plasma reactors used are barrel and parallel plated reactors. Typical conditions for etching with fluorine-containing gases, such as $SF_6$, $CF_4$ or $CF_4/6\%$ $O_2$, in a parallel plate reactor are: gas pressure from 10 mtorr to 1 torr, power from 0.11 $W/cm^2$ to 0.66 $W/cm^2$. The polymer according to the invention shows excellent etching stability to fluorine-containing plasmas at strip rates from 200 Å minute to 700 Å/minute, depending on the conditions employed.

In the Examples which follow, parts and percentages are by weight, unless otherwise stated.

EXAMPLE 1

Preparing light-sensitive polymers (a) Synthesis of copolymers 10 parts of p-t-butoxycarbonyloxystyrene (A), prepared according to Polymer 24 (1983), 999, and 1.2 parts of o-nitro-α-methylbenzyl methacrylate (B) are dissolved in 10 parts by volume of ethyl acetate. After 0.082 part of azobisisobutyronitrile has been added, the mixture is heated at 70°–80° C. under nitrogen for 16 hours. The viscous solution is diluted with ethyl acetate and precipitated in naphtha. After washing with naphtha and methanol the polymer is dried under reduced pressure. The yield is 6.1 parts. The IR spectrum shows carbonyl bands at 1760 $cm^{-1}$ (carbonate) and 1720 $cm^{-1}$ (ester) and also the nitro band at 1530 $cm^{-1}$.

Further polymers of different compositions are prepared analogously to the above method:

| Monomer composition | | Initiator mol %, based on monomers (A) + (B) | (B) content (%) in polymer | Reaction time (hours) | Yield (%) |
| --- | --- | --- | --- | --- | --- |
| (A) | (B) (parts) | | | | |
| 10 | 14.4 | 1 | 62.0 | 16 | 24 |
| 10 | 7.0 | 1 | 45.3 | 16 | 32 |
| 10 | 2.3 | 1 | 26.6 | 16 | 59 |
| 10 | 1.2 | 1 | 21.8 | 16 | 54 |
| 10 | 0.6 | 1 | 12.0 | 24 | 72 |

(b) Synthesis of terpolymers 10 parts of p-t-butoxycarbonyloxystyrene (A), 9.4 parts of o-nitro-α-methylbenzyl methacrylate and 1.3 parts of methacrylic acid are dissolved in 50 parts by volume of ethyl acetate and polymerized by means of 0.130 part of azobisisobutyronitrile at 70°–80° C. in the course of 8 hours. Precipitating in naphtha and drying gives 7.0 parts of polymer. Titration with 0.01 N KOH indicates a methacrylic acid content of 4%.

Removal of protective group (c) In substance 1.0 g of the copolymer prepared in Example 1 (a) is heated at 200° C. in a drying cabinet for 20 minutes. The polymer weight loss is 0.35 g. NMR and IR spectra indicate that the protective group has been completely removed.

(d) In solution 1.0 g of the copolymer prepared in Example 1 (a) is dissolved in 10 ml of dichloromethane. 0.5 ml of trifluoroacetic acid is added, and gas immediately begins to evolve. After gas evolution has ceased, the mixture is stirred at room temperature for 15 minutes and then precipitated in 100 ml of naphtha. NMR and IR spectra of the precipitated polymer show that the protective group has been completely removed and a phenolic polymer has formed.

EXAMPLE 2

Preparation of resist solutions, exposure and development

Poly(o-nitro-α-methylbenzyl methacrylate-co-p-t-butoxycarbonyloxystyrene) (Mn: 14,000 g/mol), prepared as described in Example 1(a), is dissolved in diethylene glycol dimethyl ether to give a solution having a solids content of 30%. The solution is filtered through a 0.2 μm Teflon filter and spuncoated at 2,450 r.p.m. onto a silicon wafer to produce a layer 1 μm in thickness. The wafer is then baked at 180oC for 2 minutes and exposed through a structured chromium-coated quartz mask by the contact technique. The light source used is an Excimer laser from Lambda Physics, which emits monochromatic light of wavelength 248 nm when the gas medium is krypton and fluorine. After exposure at 400 $mJ/cm^2$ the imagewise exposed areas are developed with 2% strength aqueous tetramethylamonium hydroxide solution for 60 seconds to leave positive resist structures of good quality.

EXAMPLE 3

A copolymer prepared as described in Example 1(a) is dissolved, the solution is filtered, and the filtrate is spuncoated onto a wafer, all three steps being carried out as described in Example 2. The wafer is then baked at 130° C. for 2 minutes and exposed. Directly after imagewise exposure the exposed film is not developable with 2% strength aqueous tetramethylammonium hydroxide solution. If, however, exposure is immediately followed by a bake at 180° C. for 2 minutes, the resist can be developed as in Example 2.

EXAMPLE 4

The polymer prepared as described in Example 1,(b) is dissolved in diethylene glycol dimethyl ether to give a 30% strength solution, and a 0.8 μm layer is applied to a wafer. The wafer is baked at 180° C. for 2 minutes, exposed to the Excimer laser at 248 nm (140 $mJ/cm^2$) for 4 seconds and then developed for 60 seconds with a commercial developer (Developer S from Kodak). The unexposed areas are stripped of 3%. The exposed areas are completely stripped. Resolution of structures in the submicron range is good.

EXAMPLE 5

The poly(o-nitro-α-methylbenzylmethacrylate-co-p-hydroxystyrene) prepared as described in Example 1(d) is dissolved in diethylene glycol dimethyl ether, and the solution is filtered. The filtrate is spuncoated onto a wafer in a 1 μm thick polymer film.. The wafer is baked at 130° C. for 2 minutes and exposed and developed, the last two steps being carried out as described in Example 2. Again the result comprises resist tracks of high resolution.

EXAMPLE 6

Determination of plasma etch stability

The etch experiments are carried out in a parallel plate reactor (from Plasma Technology). The substrates to be etched are positioned on the lower, cooled electrode. To produce the plasma, the upper electrode is connected to a 13.56 MHz high frequency generator. The etching gas used is $CF_4/6\%$ $O_2$ under a gas pressure of 50 mtorr. The energy setting is 0.22 W/cm². The etch stability of the resist structures produced as described in Example 2 is compared in the same process with commercial resists (novolak or polymethyl methacrylate positive resist). To this end, 1 μm thick layers of polymer are applied in each case to silicon wafers, and the wafers are baked before etching at 200° C. for 2 minutes. 5 wafers at a time were positioned on the lower electrode, the chamber was evacuated, etching gas was introduced and, after the pressure had stabilized, the plasma was ignited. The layer thickness before and after each etching cycle is measured with an α-step profilometer. The following strip rates are found:

Polymethyl methacrylate resist 960 Å/min

Novolak resist 640 Å/min

Example 2 650 Å/min (structures as in Example 2)

We claim:

1. A copolymer which contains as copolymerized units (a) from 5 to 50 mol % of one or more compounds of the formula (I)

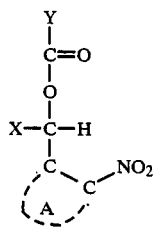

(I)

where A is an aromatic or heteroaromatic, substituted or unsubstituted ring system of 5 to 14 ring members, X is hydrogen, alkyl of 1 to 8 carbon atoms, or substituted or unsubstituted aryl or aralkyl, and Y is an ethylenically unsaturated radical of 2 to 6 carbon atoms, (b) from 95 to 50 mol % of one or more compounds of the formula (II)

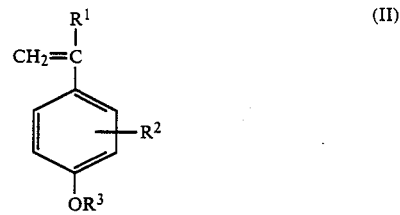

(II)

where $R^1$ is hydrogen or methyl, $R^2$ is hydrogen, halogen or alkyl of 1 to 6 carbon atoms, $R^3$ is hydrogen, alkyl of 1 to 6 carbon atoms, acetyl, benzoyl, $C_1$-$C_6$-alkylsilyl, $C_1$-$C_6$-alkoxysilyl or tert.-butoxycarbonyl, and (c) from 0 to 30 mol % of one or more further olefinically unsaturated, copolymerizable organic compounds, other than (a) and (b), whose homopolymers are transparent within the wavelength region from 250 to 400 nm, with the proviso that the percentages mentioned under (a) to (c) add up to 100.

2. A copolymer as claimed in claim 1, wherein the radical Y in the formula (I) is one of the radicals

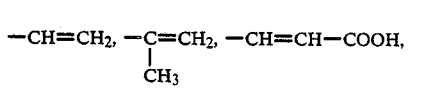

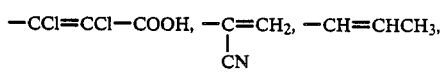

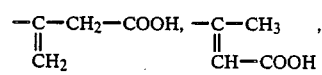

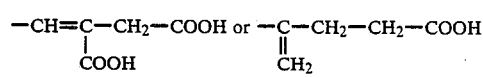

3. A copolymer as claimed in claim 1, wherein in the formula (I) the radical A is phenyl, the radical X is methyl and the radical Y is a

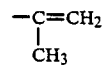

group.

4. A copolymer as claimed in claim 1 wherein in the formula (II) $R^3$ is hydrogen, methyl or tert.-butoxycarbonyl.

5. A process for preparing a copolymer as claimed in claim 1, which comprises polymerizing the compounds mentioned under (a) to (c) in the presence of a free radical initiator, with the proviso that $R^3$ of component (b) is alkyl of 1 to 6 carbon atoms, acetyl, benzoyl, $C_1$-$C_6$-alkylsilyl, $C_1$-$C_6$-alkoxysilyl or tert.-butoxycarbonyl, and if appropriate converting the copolymer obtained into the copolymer where $R^3$ is H.

* * * * *